United States Patent [19]

Nakanishi et al.

[11] Patent Number: 5,061,591

[45] Date of Patent: Oct. 29, 1991

[54] PRESENSITIZED ALUMINUM LITHOGRAPHIC PLATE HAVING THEREON A POSITIVE OR NEGATIVE WORKING LIGHT SENSITIVE LAYER

[75] Inventors: Haruo Nakanishi; Hirokazu Sakaki, both of Shizuoka, Japan

[73] Assignee: Fuji Photo Film Co., Ltd., Kanagawa, Japan

[21] Appl. No.: 359,344

[22] Filed: May 31, 1989

[30] Foreign Application Priority Data

Jun. 1, 1988 [JP] Japan ..................... 63-134707

[51] Int. Cl.[5] .................. G03C 1/77; G03F 7/008; G03F 7/021; G03F 7/022

[52] U.S. Cl. .................. 430/159; 430/157; 430/158; 430/175; 430/176; 430/192; 430/193; 430/197; 430/278; 430/302; 204/33; 101/459

[58] Field of Search .............. 430/278, 302, 157, 197, 430/175, 176, 192, 193, 158, 159; 428/611, 612, 650; 204/33; 101/459

[56] References Cited

U.S. PATENT DOCUMENTS

| | | | |
|---|---|---|---|
| 4,301,229 | 11/1981 | Sakaki et al. | 430/278 |
| 4,427,500 | 1/1984 | Platzer | 430/278 |
| 4,476,006 | 10/1984 | Ohba et al. | 430/278 |
| 4,576,893 | 3/1986 | Nakakita et al. | 430/157 |
| 4,581,996 | 4/1986 | Platzer | 430/302 |
| 4,634,656 | 1/1987 | Ohashi et al. | 430/302 |
| 4,801,527 | 1/1989 | Takamiya et al. | 430/302 |

*Primary Examiner*—Charles L. Bowers, Jr.
*Assistant Examiner*—John S. Y. Chu
*Attorney, Agent, or Firm*—Burns, Doane, Swecker & Mathis

[57] ABSTRACT

The present invention relates to an aluminum support for a lithographic plate, whose surface is electrochemically roughened and has the following conditions:

a) an arithmetic mean of the pit diameters of the electrolytically etched support is 4 μm or less, b) a difference between an arithmetic mean ($D_L$) of the maximum pit diameter of the support in the rolling direction and an arithmetic mean ($D_{LT}$) of the maximum pit diameter of the support in the direction perpendicular to the rolling direction is larger than 10% of the maximum pit diameter (a larger one of $D_L$ and $D_{LT}$), c) the number of pits detected with a surface roughness tester having a profilometer using a stylus having a tip radius of 1 μm is at last 200/mm, and d) an average centerline roughness is 0.2 μm to 1.0 μm.

According to the present invention, a lithographic plate having the aluminum support is excellent in both of a printing durability and a stain proofness.

7 Claims, No Drawings

PRESENSITIZED ALUMINUM LITHOGRAPHIC PLATE HAVING THEREON A POSITIVE OR NEGATIVE WORKING LIGHT SENSITIVE LAYER

BACKGROUND OF THE INVENTION

1. Field of the Invention

The present invention relates to an aluminum support for a lithographic plate, which support has the surface roughened by an electrolytic etching. In particular, the present invention relates to an aluminum support for a lithographic plate satisfying the following conditions:

(a) an arithmetic mean of the pit diameters of the electrolytically etched support is 4 μm or less, (b) a difference between an arithmetic mean ($D_L$) of the maximum pit diameter of the support in the rolling direction and an arithmetic mean ($D_{LT}$) of the maximum pit diameter of the support in the direction perpendicular to the rolling direction is larger than 10% of the maximum pit diameter (a larger one of $D_L$ and $D_{LT}$), (c) the number of pits detected with a contact profile recording instrument used for surface roughness (hereinafter referred to as "a profilometer") using a stylus having a tip radius of 1 μm is at least 200/mm, and (d) an average centerline roughness is 0.2 μm to 1.0 μm.

2. Prior Art

Aluminum sheets have been widely used as supports of lithographic plates. The surface of the support is roughened or grained in order to facilitate the adhesion between the support and the photosensitive layer and to impart water-retaining properties to a non-image area.

The graining is conducted by a mechanical method such as a sandblasting method, ball graining method, wire graining method, brush graining method wherein a nylon brush and an aqueous abrasive slurry are used, or a method wherein an aqueous abrasive slurry is sprayed on the support surface at a high speed, or by a chemical method wherein the support surface is roughened with an etching agent comprising an alkali, an acid or a mixture of them. Further, an electrochemical graining method is described in Japanese Patent Unexamined Published Application (hereinafter referred to as 'J. P. KOKAI') Nos. 54-146234 and 48-28123, a combination of the mechanical graining method with the electrochemical graining method is described in, for example, J. P. KOKAI No. 53-123204 and a combination of the mechanical graining method with the chemical graining method wherein a saturated aqueous solution of an aluminum salt of a mineral acid is used is described in U.S. Pat. No. 4,242,417.

Among the above-described surface-roughening methods, the electrolytic roughening method is preferred, because the pattern of the roughened surface can be easily controlled and the fine roughened surface can be formed.

Literatures which disclose the characterization of the surface pattern have been known. For example, U.S. Pat. No. 4,301,229 describes the cumulative frequency distribution of the pit diameter and the average roughness of the centerline; U.S. Pat. No. 3,861,917 describes the depth of the rough surface; Canadian Patent No. 955,449 describes the height and diameter of the peaks on the rough surface; West German Patent No. 1,813,443 describes the difference in heights of the peaks on the rough surface; and J. P. KOKAI No. 55-132,294 describes the average depth (the average roughness determined with a profilometer).

Although various parameters are defined in these techniques, both of the printing durability and the stain-proofness of the non-image area cannot be obtained at the same time by them.

U.S. Pat. No. 4,581,996 discloses a lithographic substrate whose electrolytically grained surface is defined by specific six parameters including a distribution of pit diameters, a pit diameter directionality, a centerline average roughness and a roughness directionality.

However, this specification is silent on the relation between (1) the printing durability and stain-proofness of the non-image area and (2) the parameters.

SUMMARY OF THE INVENTION

After intensive investigations made on the relation between parameters and the surface pattern of a lithographic support having both of a printing durability and a stain-proofness of the non-image area during the printing, the inventors have found out that a printing durability and a stain-proofness of the non-image area can be obtained at the same time using an aluminum support satisfying the specific conditions, in particular, a difference between an arithmetic mean ($D_L$) of the maximum pit diameter of the aluminum sheet in the rolling direction and an arithmetic mean ($D_{LT}$) of the maximum pit diameter of the support in the direction perpendicular to the rolling direction is larger than 10% of the maximum pit diameter (a larger one of $D_L$ and $D_{LT}$). The present invention has been completed on the basis of this finding.

Namely, the present invention relates to an aluminum support for a lithographic plate characterized in that the support is prepared by electrochemically roughening an aluminum sheet and has the following properties:

(a) an arithmetic mean of pit diameters is 4 μm or less, (b) a difference between an arithmetic mean ($D_L$) of the maximum pit diameter of the aluminum support in the rolling direction and an arithmetic mean ($D_{LT}$) of the maximum pit diameter of the aluminum support in the direction perpendicular to the rolling direction is larger than 10% of the maximum pit diameter (either a larger one of $D_L$ and $D_{LT}$), (c) the number of pits detected with a profilometer using a stylus having a tip radius of 1 μm is at least 200/mm, and (d) an average centerline roughness is 0.2 μm to 1.0 μm.

DETAILED DESCRIPTION OF THE INVENTION

The aluminum sheet usable in the present invention includes a pure aluminum sheet and aluminum alloy sheets. Various aluminum alloys such as alloys of aluminum with a metal selected from Fe, Si, Cu, Mn, Mg, Cr, Zn, Ti, Pb, Ni, etc. are usable. For example, commercially available aluminum sheets such as JIS 1050, 1100 and 3003 aluminum sheets are usable.

In conducting the present invention, the aluminum sheet is preferably cleaned to remove an oil, grease, rust, dust, etc. from its surface. It is cleaned by, for example, degreasing with a solvent such as trichloroethylene or degreasing by etching with an alkali such as sodium hydroxide, etc. Since smut is formed in the degreasing by etching with an alkali such as sodium hydroxide, a desmutting treatment (for example, immersion in a 10 to 30% nitric acid solution) is usually conducted in order to remove the smut.

After the above-described pretreatment, the sheet is electrolytically grained by a known process, to form a uniform rough surface.

The electrolytic solution usable in the electrolytic graining treatment may be any of those usually used in an alternating current electrolytic graining treatment. Particularly preferred are a 2 to 40 g/l aqueous nitric acid solution, a 2 to 40 g/l aqueous hydrochloric acid solution and an aqueous solution containing 2 to 40 g/l in total of both nitric acid and hydrochloric acid. When the concentration of the electrolyte is less than 2 g/l, it is difficult to conduct the graining treatment and an effective number of pits is hardly obtained. On the contrary, when it exceeds 40 g/l, the formed pits become quite ununiform due to the chemical dissolution of the aluminum surface in the electrolytic solution and also due to the oxidation of the surface. The treatment temperature usually ranges from ambient temperature to 70° C., preferably from ambient temperature to 50° C. A corrosion inhibitor such as a carboxylic acid, an amine, a ketone or an aldehyde may be added thereto.

The electric current to be employed in the electrolytic graining treatment may be a commercial alternating current or an alternating wave current such as sinusoidal wave, rectangular wave or trapezoidal wave current.

The current density is preferably in the range of 10 to 200 A/dm$^2$. When it is lower than 10 A/dm$^2$, the pit formation is quite difficult and, on the contrary, when it exceeds 200 A/dm$^2$, the formation of the uniform pits is difficult.

The aluminum support having the surface pattern having the above-described characteristics is formed by suitably controlling the composition of the electrolytic solution, temperature, current density, quantity of electricity, stirring condition of the electrolytic solution, etc. in the electrolytic graining step.

The arithmetic means $D_L$ and $D_{LT}$ of the pit diameters are determined by measuring the diameters of about 1,000 pits in an electron photomicrograph at magnifications between 1000 to 3000 times using a scanning electron microscope.

The surface of the aluminum sheet is straight scanned with a profilometer having a tip radius of 1 μm and the number of the pits is determined from a chart thus formed. Depressions having depth of 0.01 μm or less are not regarded as pits. When the number of pits is less than 200/mm, the printing durability is seriously reduced.

The arithmetic mean of the pit diameters is 4 μm or less, preferably 0.5 to 4 μm. When it exceeds 4 μm, the stain in the non-image area is increased. On the contrary, when it is less than 0.5 μm, the printing durability is poor. The ratio of the difference between $D_L$ and $D_{LT}$ to the maximum pit diameter is higher than 10%. When it is 10% or less, the printing durability and the stain in the non-image area are inferior to those observed when the ratio is higher than 10%. The ratio is preferably higher than 12%. In a continuous production process, this ratio is far larger. By this directional dependency, the support for the lithographic plate which has both excellent printing durability and stain-proofness during the printing can be obtained.

When the average centerline roughness is less than 0.2 μm, the printing durability is quite poor and, on the contrary, when it exceeds 1.0 μm, the stain of the non-image area is seriously increased.

It is preferable that the electrolytically grained aluminum sheet is chemically cleaned in order to remove the smut remaining on the surface resulted from the electrolytic graining. The details of the chemical cleaning treatment are described in U.S. Pat. No. 3,834,998 and J. P. KOKAI No. 53-12739.

An oxide layer may be formed on the resultant aluminum sheet by an anodic oxidation in order to improve water retention, adhesion to a photosensitive layer and mechanical strength of a surface of a non-image area, before the aluminum sheet is used as a lithographic support. The anodic oxidation can be conducted by a known process such as a process wherein an aqueous solution of sulfuric acid, phosphoric acid, oxalic acid, amidosulfonic acid, sulfosalicylic acid or a mixture thereof, or those solutions which further contain $Al^{3+}$ ion is used as an electrolytic solution. Although direct current is usually employed, an alternating current or a combination of them may be employed in the anodic oxidation. Preferably the electrolyte concentration is 1 to 80%, the temperature is 5° to 70° C., the current density is 0.5 to 60 A/dm$^2$ and the amount of the oxide layer is 0.3 to 5 g/m$^2$.

After the anodic oxidation, the aluminum sheet may be further treated by immersing it in an aqueous solution of an alkali metal silicate such as sodium silicate, as described in U.S. Pat. Nos. 2,714,066 and 3,181,461. Also, the sheet may be primed with a hydrophilic cellulose (such as carboxymethyl cellulose) containing a water-soluble metal salt (such as zinc acetate) as described in U.S. Pat. No. 3,860,426. Further, the sheet may be treated with polyvinylphosphonic acid as described in U.S. Pat. No. 4,153,461.

A known photosensitive layer for pre-sensitized plates (hereinafter referred to as PS plates) can be formed on the lithographic support prepared as described above to form a photosensitive lithographic plate. It is then engraved to form a lithographic plate having excellent properties.

The compositions for forming the photosensitive layer are as follows:

(1) Photosensitive layer comprising a diazo resin and a binder.

Preferred negative working photosensitive diazo compounds include a condensate (so-called photosensitive diazo resin) of a diphenylamine-p-diazonium salt with an organic condensing agent having a reactive carbonyl group such as formaldehyde, an aldol or an acetal as described in U.S. Pat. Nos. 2,063,631 and 2,667,415. Other useful condensed diazo compounds are described in Japanese Patent Publication for Opposition Purpose (hereinafter referred to as 'J. P. KOKOKU') Nos.49-48001, 49-45322 and 49-45323. These photosensitive diazo compounds are usually obtained in the form of water-soluble inorganic salts thereof and, therefore, they can be applied in the form of an aqueous solution thereof. The water-soluble diazo compound can be reacted with an aromatic or aliphatic compound having one or more phenolic hydroxyl groups, sulfonic acid groups or both of them to form a substantially water-insoluble photosensitive diazo resin according to the process described in J. P. KOKOKU No.47-1167.

Further, this compound can be reacted with a hexafluorophosphate or tetrafluroroborate to form a reaction product to be used as a photosensitive compound, as described in J. P. KOKAI No.56-121031.

The reactants having the phenolic hydroxyl group include, for example, hydroxybenzophenones, 4,4-bis(4'-hydroxyphenyl)pentanoic acid, resorcinol and diphenolic acids such as diresorcinol. They may further contain a substituent. The hydroxybenzophenones include, for example, 2,4-dihydroxybenzophenone, 2-hydroxy-4-methoxybenzophenone, 2,2'dihydroxy-4,4'-dimethoxybenzophenone and 2,2',4,4'-tetrahydroxybenzophenone. Preferred sulfonic acids include, for example, aromatic sulfonic acids such as benzene-, toluene-, xylene, naphthalene-, phenol-, naphthol- and benzophenonesulfonic acids as well as their soluble salts such as ammonium and alkali metal salts. The sulfonic acid group-containing compounds may be usually substituted with a lower alkyl group, nitro group, halogen atom and/or another sulfonic acid group. Preferred examples of these compounds include benzenesulfonic acid, toluenesulfonic acid, p-dodecylbenzenesulfonic acid, naphthalenesulfonic acid, 2,5dimethylbenzenesulfonic acid, sodium benzenesulfonate, naphthalene-2-sulfonic acid, 1-naphthol-2(or 4)-sulfonic acid, 2,4-dinitro-1-naphthol-7-sulfonic acid, 2-hydroxy-4-methoxybenzophenone-5-sulfonic acid, sodium m-(p'-anilinophenylazo)benzenesulfonate, alizarinsulfonic acid, o-toluidine-m-sulfonic acid and ethanesulfonic acid. Alcohol sulfonates and their salts are also useful. These compounds are usually easily available on the market as anionic surfactants. They include, for example, ammonium and alkali metal salts of lauryl sulfate, alkylaryl sulfates, p-nonylphenyl sulfates, 2-phenylethyl sulfates and isooctylphenoxydiethoxyethyl sulfate.

These substantially water-insoluble photosensitive diazo resins can be isolated as precipitate by mixing the water-soluble photosensitive diazo resin with an aqueous solution of the above-described aromatic or aliphatic compound in preferably equal amounts.

In addition, the diazo resins described in British Patent No. 1,312,925 are also preferred.

The most suitable diazo resin is 2-methoxy-4-hydroxy-5-benzoylbenzenesulfonic acid salt, p-dodecylbenzenesulfonic acid salt or hexafluorophosphate of a condensate of p-diazodiphenylamine with formaldehyde.

A suitable amount of the diazo resin contained in the photosensitive layer is 5 to 50 wt. %. As the amount of the diazo resin is reduced, the photosensitivity is increased as a matter of course, but the storability is reduced. The optimum amount of the diazo resin is about 8 to 20 wt. %.

Various high molecular weight compounds are usable as binders. Among them, those having a hydroxyl group, amino group, carboxylic acid group, amido group, sulfonamido group, active methylene group, thioalcohol group and epoxy group are preferred in the present invention. Preferred binders include, for example, shellac described in British Patent No. 1,350,521, the polymers comprising hydoxyethyl acrylate or hydroxyethyl methacrylate as main recurring units as described in British Patent No. 1,460,978 and U.S. Pat. No. 4,123,276, the polyamide resins described in U.S. Pat. No. 3,751,257, the phenolic resins and polyvinyl acetal resins such as polyvinyl formal resin and polyvinyl butyral resin as described in British Patent No. 1,074,392, and the linear polyurethane resin as described in U.S. Pat. No. 3,660,097, polyvinyl alcohol phthalate resin, epoxy resin which is a condensate of bisphenol A and epichlorohydrin, amino group-containing polymers such as polyaminostyrene and polyakylamino (meth)acrylates, and cellulose derivatives such as cellulose acetate, cellulose alkyl ethers and cellulose acetate phthalate.

More preferred binders are organic high molecular compounds which have an acid value of 10 to 200, preferably 20 to 100, are substantially water insoluble (namely, insoluble in neutral or acidic aqueous solutions) and have a film-forming property. Preferably, such binders have, in addition to the above properties, another property that they can dissolve or swell in aqueous alkali solution series developing solutions, and can be photohardened in coexistence with the above-mentioned light-sensitive diazo resin, whereby they are converted to compounds insoluble or not swelling in the above developing solutions. Acid value of less than 10 makes development difficult, and acid value exceeding 200 makes image intensity at development strikingly weak.

Particular preferred examples of binders are copolymers containing acrylic acid, methacrylic acid; crotonic acid or maleic acid as an essential component, for example, multicomponent copolymers consisting of 2-hydroxydiethyl acrylate (or 2-hydroxyethyl methacrylate), acrylonitrile (or methacrylonitrile), acrylic acid (or methacrylic acid), and, if necessary, another copolymerizable monomer, as disclosed in U.S. Pat. No. 4,123,276; multicomponent copolymers consisting of acrylic acid (or methacrylic acid) esterified with a group which has an hydroxyl group at the end and contains a dicarboxylic acid ester residue, acrylic acid (or methacrylic acid), and, if necessary, another copolymerizable monomer, as disclosed in J. P. KOKAI No.53-120903; multicomponent copolymers consisting of a monomer having an aromatic hydroxyl group at the end (e.g., N-(4-hydroxyphenyl)methacrylamide), acrylic acid (or methacrylic acid), and, if necessary, another copolymerizable monomer, as disclosed in J. P. KOKAI No. 54-98614; and multicomponent copolymers consisting of alkyl acrylate, acrylonitrile (or methacrylonitrile) and an unsaturated carboxylic acid. In addition, acidic polyvinyl alcohol derivatives and acidic cellulose derivatives are also useful. Further, binders disclosed in U.S. Pat. Nos. 3,732,105 and 4,387,151 and 4,631,245, and J. P. KOKAI No. 62-58242 and G. B. 2,185,120A where polyvinyl acetal or polyurethane have been made alkali soluble are also useful.

The composition comprising the diazo resin and the binder can further contain the additives such as a pH indicator as described in British Patent No. 1,041,463, and phosphoric acid and the dye as described in U.S. Pat. No. 3,236,646.

(2) Photosensitive layer comprising an o-quinone diazide.

The most suitable o-quinone diazide compounds are o-naphthoquinone diazide compounds. They are described in many publications such as U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709 and 3,647,443. They are preferably used in the present invention. Among them, o-naphthoquinonediazide sulfonic acid esters and o-naphthoquinonediazide carboxylic acid esters of aromatic hydroxy compounds and o-naphthoquinonediazide sulfonic acid amides and o-naphthoquinonediazide carboxylic acid amides of aromatic amino compounds are particularly preferred. Further, more preferred are the esterification reaction product of pyrogallol/acetone condensate with o-naphthoquinonediazidosulfonic acid as described in U.S. Pat. No. 3,635,709, the esterification reaction product of a polyester having terminal hydroxyl group with o-naphthoquinonediazidosulfonic acid or o-naphthoquinonediazidocarboxylic acid as described in U.S. Pat. No. 4,028,111, the esterification reaction product of a p-hydroxystyrene homopolymer or a copolymer thereof with a monomer copolymerizable therewith with o-naphthoquinonediazidosulfonic acid or o-naphthoquinonediazidocarboxylic acid as described in British Patent No. 1,494,043, and the amidation reaction product of a copolymer (of p-aminostyrene with another monomer copolymerizable therewith) with o-naphthoquinonediazidosulfonic acid or o-naphthoquinonediazidocarboxylic acid as described in U.S. Pat. No. 3,759,711.

Although the o-quinonediazide compounds can be used solely, they are preferably used together with an alkali-soluble resin. The preferred alkali-soluble resins include novolak phenol resins such as phenol formaldehyde resin, o-cresol formaldehyde resin and m-cresol formaldehyde resin. It is further desirable to use the above-described phenol resin in combination with a condensate of a phenol or cresol substituted with an alkyl group having 3 to 8 carbon atoms with formaldehyde, such as t-butylphenol/formaldehyde resin. The amount of the alkali-soluble resin is about 50 to 85 wt. %, preferably 60 to 80 wt. %, based on the total composition constituting the photosensitive layer.

The photosensitive composition comprising the o-quinonediazide compound can further contain, if necessary, additives such as a dye, a plasticizer and a component capable of imparting a printing-out effect, as described in, for example, British Patent Nos. 1,041,463 and 1,039,475 and U.S. Pat. No. 3,969,118.

(3) Photosensitive layer comprising an azide compound and a binder (a polymer).

The compositions constituting this layer include, for example, those comprising an azide compound and a water-soluble or alkali-soluble polymer as described in British Patent Nos. 1,235,281 and 1,495,861 and J. P. KOKAI Nos. 51-32331 and 51-36128, and those comprising an azide group-containing polymer and a polymer as a binder as described in J. P. KOKAI Nos. 50-5102, 50-84302, 50-84303 and 53-12984.

(4) Other photosensitive resin layers.

The photosensitive resins include, for example, the polyester compounds disclosed in J. P. KOKAI No. 52-96696, the polyvinyl innamate resins described in British Patent Nos. 1,112,277, 1,313,390, 1,341,004 and 1,377,747, and the photo-polymerizable photopolymers described in U.S. Pat. Nos. 4,072,528 and 4,072,527.

(5) Electrophotographic photosensitive layer.

For example, the ZnO photosensitive layer disclosed in U.S. Pat. No. 3,001,872 can be used.

A photosensitive layer comprising an electrophotographic sensitizer as described in J. P. KOKAI Nos. 56-161550, 60-186847 and 61-238063 is usable.

The amount of the photosensitive layer formed on the support ranges from about 0.1 to about 7 $g/m^2$, preferably 0.5 to 4 $g/m^2$.

After the image-forming exposure, the PS plate is subjected to ordinary treatments including developing treatment, to form a resin image. For example, a PS plate having the above-described photosensitive layer (1) comprising the diazo resin and the binder is subjected to image-forming exposure and then the photosensitive layer of the unexposed area is removed by development with, for example, a developer as described in U.S. Pat. No. 4,186,006 to form the lithographic plate. A PS plate having the above-described photosensitive layer (2) is subjected to the image-forming exposure and then the photosensitive layer of the unexposed area is removed by development with, for example, an aqueous alkali solution as described in U.S. Pat. No. 4,259,434 to form a lithographic plate.

The following examples will further illustrate the present invention, wherein percentages are given by weight unless otherwise stated.

EXAMPLE 1

A JIS 1100 aluminum sheet having a thickness of 0.24 mm was immersed in a 10% aqueous sodium hydroxide solution at 50° C. for 20 sec to degrease and clean it. The sheet was washed with water, and neutralized and cleaned with a 10% aqueous nitric acid solution and then washed with water.

The resultant sheet was electrolytically grained with a rectangular wave alternating current at a current density of 50 $A/dm^2$ in a 15 g/l aqueous nitric acid solution at 35° C. until a uniform pit surface was obtained when observed by an electron photomicrograph taken 1,500 times as large as the original scale (hereinafter referred to SEM photograph).

The aluminum sheet having the electrolytically grained surface was immersed in a 20% aqueous sulfuric acid solution at 60° C. for 1 min to dissolve and thereby to remove the smut. The sheet was then subjected to the anodic oxidation with 3 $A/dm^2$ direct current in 15% aqueous sulfuric acid solution to form 2 $g/m^2$ of an oxide layer. It was washed with water, immersed in a 3% aqueous sodium silicate solution, washed with water and dried.

The arithmetic mean of the pit diameters was 1.5 μm. The ratio of the difference between $D_L$ and $D_{LT}$ to the maximum pit diameter was 12%. The surface roughness was 290/mm in terms of the number of pits measured with a profilometer using a stylus having a tip radius of 1 μm. The average centerline roughness was 0.35 μm.

A photosensitive solution having the following composition was applied to the resultant support and then dried, to form a photosensitive layer. The amount of the photosensitive layer after drying was 2.0 $g/m^2$.

| Photosensitive solution: | |
|---|---|
| N-(4-Hydroxyphenyl)methacrylamide/2-hydroxyethyl methacrylate/acrylonitrile/methyl methacrylate/methacrylic acid (molar ratio: 15/10/30/38/7) copolymer (average molecular weight: 60,000) | 5.0 g |
| 4-Diazodiphenylamine/formaldehyde condensate hexafluorophosphate | 0.5 g |
| Phosphorous acid | 0.05 g |
| Victoria Pure Blue BOH (a product of Hodogaya Chemical Co., Ltd.) | 0.1 g |
| 2-Methoxyethanol | 100 g |

The photosensitive lithographc plate thus prepared was exposed to light of a metal halide lamp through a negative image film, developed with a standard DN-3C developer for negative working PS plates (a product of Fuji Photo Film Co., Ltd.), and gummed, to form a lithographic plate. 100,000 sheets of an excellent print were able to be produced by an ordinary process. Even when the quantity of dampening water was changed during the printing operation, the non-image area was scarcely stained.

EXAMPLE 2

The same procedure as that of Example 1 before the printing operation except that a JIS 3003 aluminum sheet having a thickness of 0.24 mm was used and that the surface was evenly roughened at a current density of 40 A/dm$^2$ in a 5 g/l aqueous hydrochloric acid solution at 35° C.

The arithmetic mean of the pit diameters was 3.5 μm. The ratio of the difference between $D_L$ and $D_{LT}$ to the maximum pit diameter was 12%. The surface roughness was 220/mm in terms of the number of pits measured with a profilometer using a stylus having a tip radius of 1 μm. The average centerline roughness was 0.65 μm.

With the lithographic plate thus produced, 100,000 sheets of an excellent print were able to be produced. Even when the quantity of dampening water was changed during the printing operation, the non-image area was scarcely stained.

COMPARATIVE EXAMPLE 1

The electrolytic graining was conducted in a 20 g/l aqueous nitric acid solution at 25° C. in the same manner as that of Example 1 and printing was conducted with the lithographic plate.

The arithmetic mean of the pit diameters was 7 μm. The ratio of the difference between $D_L$ and $D_{LT}$ to the maximum pit diameter was 10%. The surface roughness was 160/mm in terms of the number of pits measured with a profilometer using a stylus having a tip radius of 1 μm. The average centerline roughness was 0.50 μm. With a lithographic plate produced by using this aluminum support, only 70,000 sheets of an excellent print were able to be produced. The non-image area Example 1.

COMPARATIVE EXAMPLE 2

The same procedure as that of Example 1 before the operation was repeated except that the electrolytic graining was conducted at a current density of 80 A/dm$^2$ in a 5 g/l aqueous hydrochloric acid solution at 35° C.

The arithmetic mean of the pit diameters of the resultant aluminum support was 5 μm. The ratio of the difference between $D_L$ and $D_{LT}$ to the maximum pit diameter was 7%. The surface roughness was 210/mm in terms of the number of pits as measured with a profilometer using a stylus having a tip radius of 1 μm. The average centerline roughness was 0.7 μm. With a lithographic plate prepared by using the aluminum support, only 70,000 sheets of a print were able to be obtained although the non-image area was scarcely stained like that of Example 1.

COMPARATIVE EXAMPLE 3

The same procedure as that of Example 1 before the printing operation was repeated except that the electrolytic graining was conducted at a current density of 40 A/dm$^2$ in a 10 g/l aqueous nitric acid solution at 30° C. for a time twice as long as that of Example 1.

The arithmetic mean of the pit diameters of the resultant aluminum support was 2 μm. The ratio of the difference between $D_L$ and $D_{LT}$ to the maximum pit diameter was 6%. The surface roughness was 300/mm in terms of the number of pits as measured with a profilometer using a stylus having a tip radius of 1 μm. The average centerline roughness was 1.10 μm.

With the lithographic plate prepared by using the aluminum support, the non-image area was stained by even only a slight change in the quantity of the dampening water, although the number of sheets printable therewith was equal to that of Example 1.

Although only the combination of the negative working photosensitive layer with the aluminum support having the surface pattern specified in the present invention is described in the above examples, the similar effects were obtained when the negative working photosensitive layer was replaced with a positive working photosensitive layer.

Thus, the lithographic plate prepared by using the aluminum support having the present surface pattern was a printing durability and a stain-proofness far more excellent than those of ordinary ones.

What is claimed is:

1. A presensitized lithographic plate which comprises an aluminum support having an anodic oxide layer and having thereon a positive or negative lithographically suitable light-sensitive layer, said aluminum support being prepared by electrochemically graining, and the surface of said anodic oxide layer having the following physical properties:

(a) an arithmetic mean or pit diameters of 4 μm or less, (b) a difference between an arithmetic mean ($D_L$) of the maximum pit diameter of the aluminum sheet in the rolling direction and an arithmetic mean ($D_{LT}$) of the maximum pit diameter of the aluminum sheet in the direction perpendicular to the rolling direction larger than 12% of the maximum pit diameter (a larger one of $D_L$ and $D_{LT}$), (c) the number of pits detected with a surface roughness tester having a profilometer using a stylus having a tip radius of 1 μm is at least 200/mm, and (d) an average centerline roughness is 0.2 μm to 1.0 μm.

2. The presensitized lithographic plate of claim 1, wherein said light-sensitive layer comprises a light-sensitive diazo resin in admixture with a polymer binder.

3. The presensitized lithographic plate of claim 2, wherein the surface of said anodic oxide layer is further treated with an aqueous solution of an alkali metal silicate.

4. The presensitized lithographic plate of claim 2, wherein said diazo resin is a condensate of a diphenylamine-p-diazonium salt with an organic condensing agent.

5. The presensitized lithographic plate of claim 2, wherein said polymer binder is a high molecular weight compound having an acid value of 10 to 200.

6. The presensitized lithographic plate of claim 5, wherein said polymer binder is selected from the group consisting of multicomponent copolymers containing (i) 2-hydroxyethyl methacrylate, (ii) acrylonitrile or methacrylonitrile, and (iii) acrylic acid or methacrylic acid; multicomponent copolymers containing (i) N-(4-hydroxyphenyl)methacrylamide and (ii) acrylic acid or methacrylic acid; alkali-soluble polyvinylacetals; and alkali-soluble polyurethanes.

7. The presensitized lithographic plate of claim 1, wherein said aluminum support is electrochemically grained in an electrolyte comprising nitric acid.

* * * * *